United States Patent
Eden

(10) Patent No.: US 6,590,916 B2
(45) Date of Patent: Jul. 8, 2003

(54) METHOD FOR FABRICATING A WAVE DIVISION LASER ARRAY MULTIPLEXER

(75) Inventor: Richard C. Eden, Briarcliff, TX (US)

(73) Assignee: Quantum Devices, Inc., Yorba Linda, CA (US)

( * ) Notice: Subject to any disclaimer, the term of this patent is extended or adjusted under 35 U.S.C. 154(b) by 107 days.

(21) Appl. No.: 09/781,103

(22) Filed: Feb. 8, 2001

(65) Prior Publication Data

US 2002/0105980 A1 Aug. 8, 2002

(51) Int. Cl.$^7$ .............................. H01S 3/00; H03B 1/00
(52) U.S. Cl. ..................... 372/38.02; 327/108
(58) Field of Search ........................ 372/23, 50, 38.02; 327/108

(56) References Cited

U.S. PATENT DOCUMENTS 5,589,786 A * 12/1996 Bella et al. .................. 327/108
5,828,246 A * 10/1998 Bostica et al. ............... 327/108
6,501,773 B1 * 12/2002 Volz et al. ................ 372/38.02

* cited by examiner

*Primary Examiner*—Quyen Leung
(74) *Attorney, Agent, or Firm*—Townsend and Townsend and Crew LLP; Kenneth R. Allen

(57) ABSTRACT

An IC laser array package is provided wherein standard CMOS integrated circuit (IC) processes are used for fabricating the controller for the laser array and wherein p-channel MOSFET devices are used as switches with the controller which short the anode of the selected laser in the array (connected to the drain of the p-channel MOSFET switches) to ground. In this structure, the modulating signal from the driver input can be applied to the common cathode substrate of the laser array bar in a standard package, along with a negative dc bias current provided from the negative voltage dc bias package pin through an inductor, in the same built-in bias tee manner previously used with a standard single-laser 14-pin package. Because the p-channel MOSFETs are used only as switches, their $f_t$ values are typically not a material hindrance to the circuit operation.

19 Claims, 3 Drawing Sheets

METHOD FOR FABRICATING A WAVE DIVISION LASER ARRAY MULTIPLEXER

BACKGROUND OF THE INVENTION

This invention relates to semiconductor laser arrays employed in communication systems.

It is desirable to provide arrays of individual broadband laser devices fabricated on a single monolithic semiconductor structure or "bar" and packaged in a standard 14-pin package previously intended for single element broadband laser devices so that the array could be operated in the same manner as a single laser element. Such plug or board-level functionality equivalence, such as signal drive requirements, bias inputs, optical power feedback, etc, would simplify upgrading. Several constraints make straightforward implementation of 14-pin packages of WDM laser arrays difficult. For example, the fabrication of WDM laser arrays (such as distributed feedback [DFB] laser arrays) is facilitated when the starting III–V-type semiconductor substrate material is an n-type. Monolithically fabricating a multiplicity (e.g., 4 or 8) of diode lasers on such a substrate and singulation into a laser array "bar" yields a common-cathode laser array configuration. In such a common-cathode laser array configuration, it is ordinarily necessary to provide a source of current for dc laser bias and ac laser modulation input signal currents into the individual anode inputs in order to operate each laser, whether individually or in groups.

The data rates of interest using these wideband lasers are typically 1.25 Gb/s to 2.5 Gb/s or more. Ordinarily, these data rate and bandwidth restraints constrain the type of IC device technology useable to provide the modulating current input to the devices. Laser driver integrated circuits that provide high-quality modulating current signals for such lasers are typically fabricated using very high speed GaAs (or other III–V semiconductor) or SiGe NPN heterojunction bipolar transistor (HBTs) device technologies. These NPN HBT technologies offer very high transistor $f_t$ values for minimum distortion of the very high speed signal modulating current waveforms (which, at the optical communications system level, maximizes the "openness" of the eye diagram, implying minimal inter-symbol interference and fast signal risetimes). Unfortunately, NPN HBT devices (as well as similar very high $f_t$ n-channel FET devices fabricated in GaAs or other III–V semiconductors) are best suited for implementing current-sinking circuits rather than current sourcing circuits. The natural high-impedance ("current sink"-like) electrode of an NPN transistor is the collector, and in an n-channel FET the high-impedance electrode is the drain, and the dc current path is from the load device (e.g., the laser) into the collector of the NPN HBT (or drain of the n-channel FET) and out of the emitter (or source) electrode. (The electron path in the NPN HBT is from the emitter to the collector; for an n-channel FET, the electron path is from the source to the drain. Since the charge of the electron is negative, the direction of conventional positive current flow is into the collector or drain.)

It would be straightforward to connect a laser array bar with the common electrode (the laser substrate) at ac ground and to connect each of the separate laser contacts to the high impedance driver device electrode (collector or drain). Unfortunately, the preferred (n-substrate) common-cathode laser array configuration is not compatible with the preferred NPN HBT or n-channel FET driver device configurations. Although the common-cathode laser array elements would require individual (positive) current sources, these NPN HBT collector and n-channel FET drain electrodes function as (positive) current sinks (negative current sources). While the use of PNP HBTs or p-channel FET devices would circumvent this incompatibility, the poorer high-speed performance of p-channel GaAs or other III–V semiconductor FETs makes them largely unavailable as elements in standard commercial ICs, just as there is virtually no availability of PNP HBT devices in commercial III–V HBT foundry processes or in commercial SiGe HBT IC production.

What is needed is a mechanism to overcome these problems, thus allowing an inexpensive CMOS IC chip to function as the laser selection device with a common-cathode (n-substrate) diode laser array bar, and allowing its packaging in a standard 14-pin laser package with board-level functionality that closely mimics the standard single laser product.

SUMMARY OF THE INVENTION

According to the invention, an IC laser array package is provided wherein standard CMOS integrated circuit (IC) processes are used for fabricating the controller for the laser array and wherein p-channel MOSFET devices are used as switches with the controller which short the anode of the selected laser in the array (connected to the drain of the p-channel MOSFET switches) to ground. In this structure, the modulating signal from the driver input can be applied to the common cathode substrate of the laser array bar in a standard package, along with a negative dc bias current provided from the negative voltage dc bias package pin through an inductor, in the same built-in bias tee manner previously used with a standard single-laser 14-pin package. Because the p-channel MOSFETs are used only as switches, their $f_t$ values are typically not a material hindrance to the circuit operation.

High modulating signal quality is achieved so long as the "off" drain capacitance of the MOSFETs is low.

In addition to the p-channel MOSFET switches themselves, the CMOS wideband WDM laser array multiplexer chip also carries serial-to-parallel decoding logic that allows the selection of the desired laser or lasers for operation at any given time to be controlled through a single package pin. This serial data laser selection input is applied through one of the two available NC ("no connect") pins of a standard 14-pin single-laser package. The other NC pin can be used to power the CMOS chip itself, or alternatively to share power and data clock/strobing functionality.

This configuration means that an array of wideband WDM (wavelength division multiplexing) lasers can be fabricated and mounted in a standard 14-pin single laser package configuration. Wideband (e.g., 2.5 Gb/s or more) laser modulating signals can be applied to the selected laser in a common-cathode laser array without actually routing the signal through the gate transconductance $g_m$ of the active MOSFET devices in the IC, which avoids degradation of the signal quality due to the limitations of the current gain-bandwidth product, $f_t$, of the MOSFETs in the IC process. Avoiding the degradation in the quality of the modulating signal applied to the selected laser is thus accomplished.

The invention will be better understood by reference to the following detailed description in connection with the accompanying drawings.

DESCRIPTION OF SPECIFIC EMBODIMENTS

Figure 1:
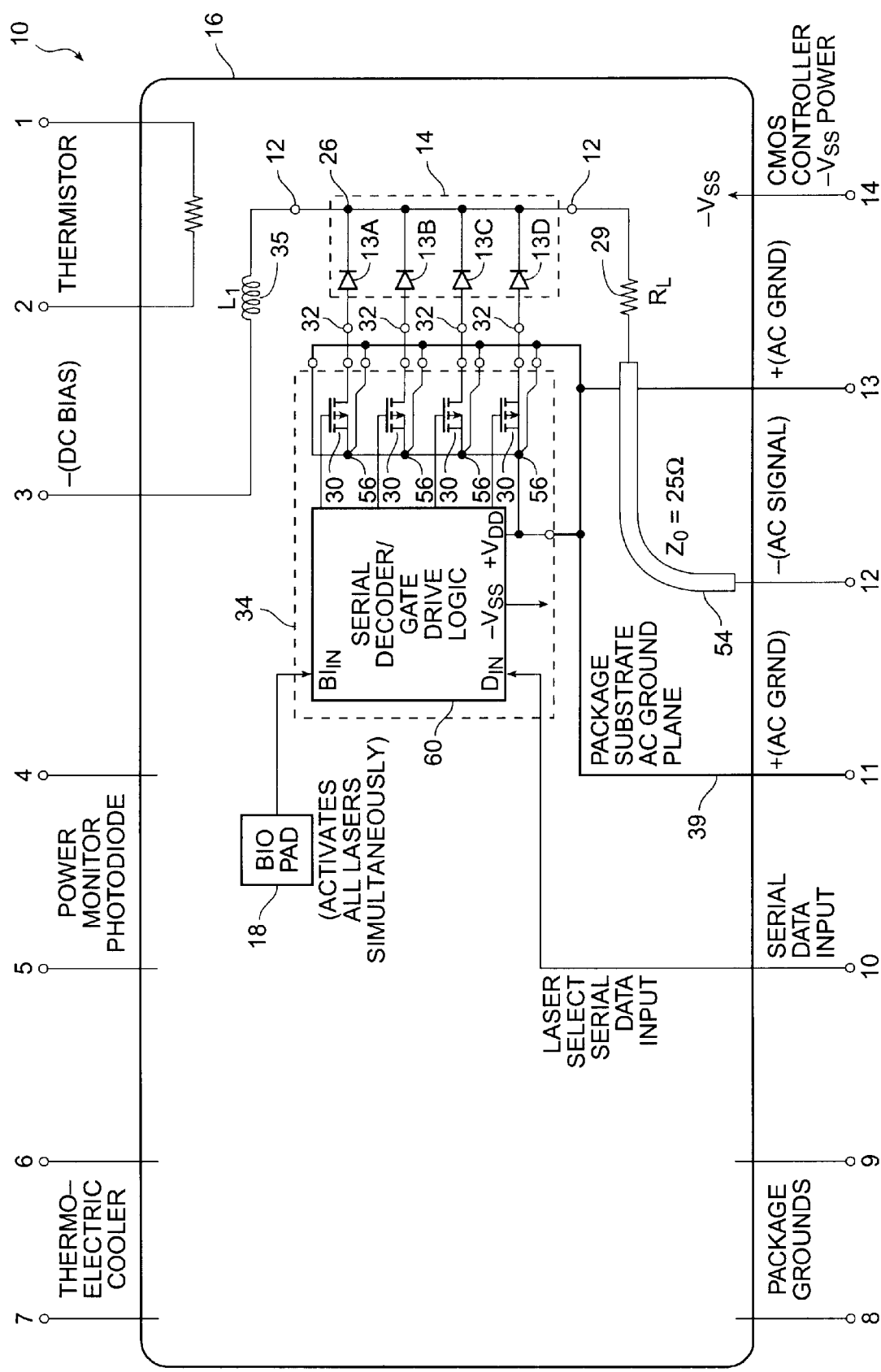
FIG. 1 is a block diagram of a laser multiplexer package according to the invention.

FIG. 1 is a diagram of a laser multiplexer package 10 which illustrates the result of an inexpensive CMOS IC chip design functioning as a laser selection device. Shown is the laser array bar 14 carrying diode lasers 13A–D with independent anode contacts 32 and common cathode (n-substrate) contact 12. Applying the signal to the common cathode electrode 12 allows a wideband WDM laser array to be packaged in a standard 14-pin single laser package 16 (FIG. 2), while retaining the board-level functionality of a standard single laser package. An enabling characteristic of the intended application is the normal intent of selecting only one laser at a time for operation. This invention, as shown in FIG. 1, has the capability to allow multiple lasers to be operated simultaneously. However, in this mode all lasers would receive the same ac modulation signal. Therefore is only necessary to explain and illustrate the case of normal use of one laser at a time selected for operation. (For initial burn-in testing of the laser arrays is an exception, in which case activation of the internal "burn-in override" pad 18 inside the package is used to activate all lasers simultaneously. This minimizes the period required to complete the burn-in qualification of the laser arrays.)

Figure 2:
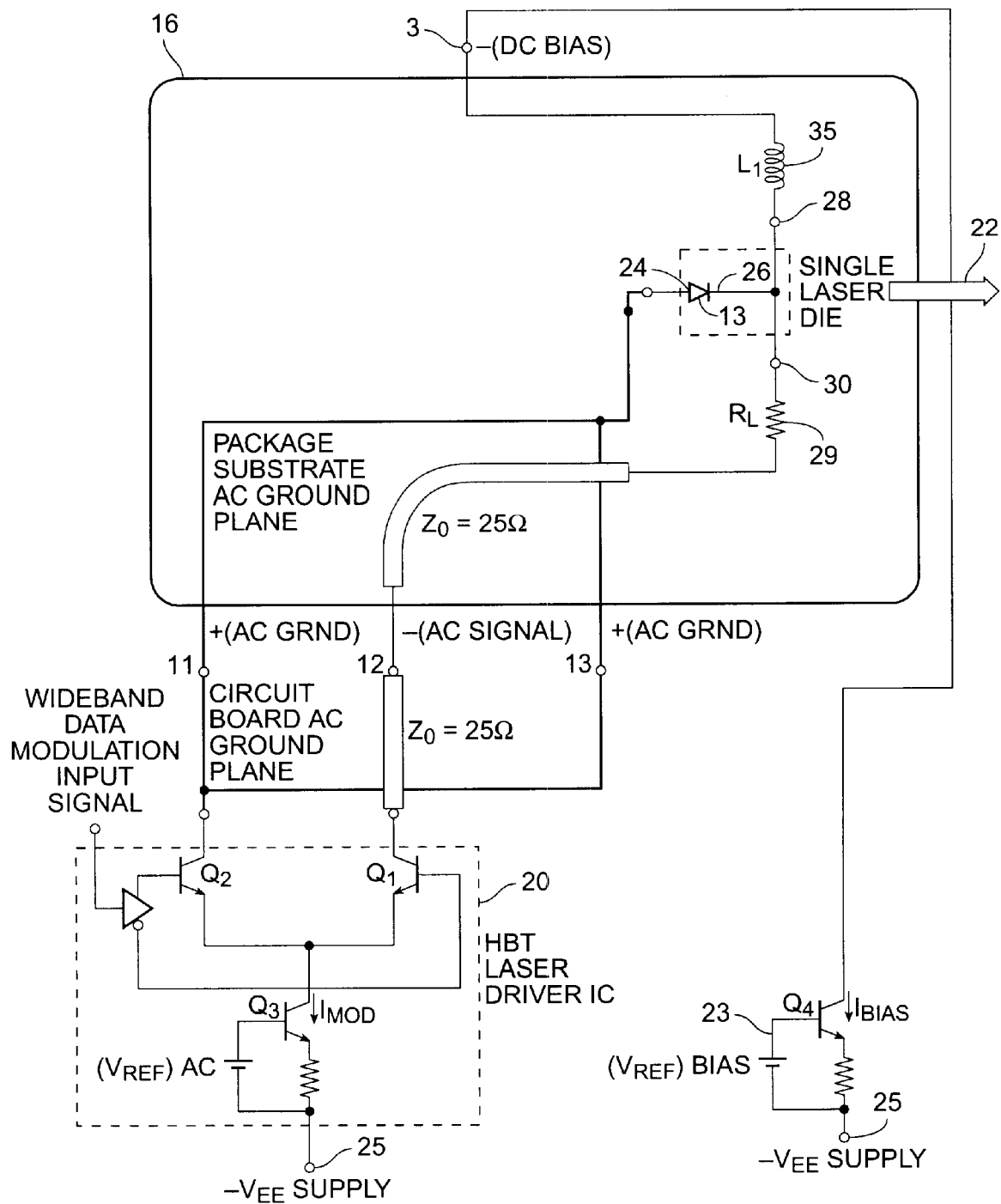
FIG. 2 is a schematic diagram of a single diode laser in a standard 14-pin package.

The operation of a standard single wideband laser packaged in a 14-pin package is shown in FIG. 2, which shows both a single laser 13 in a 14-pin package and a simplified view of the associated circuit board support electronics. An HBT laser driver chip 20 is operative to generate the wideband ac current modulation waveform at pin 12 to impress the high-speed data modulation on the laser current, and hence on its light output 22, while the dc bias generator 23 via pin 3 keeps the laser "turned on" or "lasing" at minimum power at instants when the ac modulation current is turned off. In a standard 14-pin laser package, the laser anode 24 is maintained at an ac ground potential (+ac Grnd, pin 11) which is typically about 5 volts more positive than that of the $-V_{ee}$ supply 25. The cathode 26 of the diode laser has two electric couplings. The first coupling 28 is for carrying the dc bias current $I_{bias}$ to the die through the inductor $L_1$ 35 (typically 160 nH) through pin 3, and the second coupling 30 is for carrying the data-modulated ac signal current through the transmission line ($Z_o=25$ Ω typical) from pin 12 and its termination resistor, $R_L$ 29 (typically $R_L=20$ Ω).

The action of the HBT laser driver IC 20 is to steer the constant sink current $I_{mod}$, regulated by the NPN HBT $Q_3$, in accordance with the wideband data input, either to the laser 13 (when $Q_1$ is "on" and $Q_2$ is "off"), or to ac ground (when $Q_2$ is "on" and $Q_1$ is "off"). Hence the total current through the laser 13 varies in accordance with the input data stream from a low of $I_{laser}=I_{bias}$ to a high of $I_{laser}=I_{bias}+I_{mod}$. The value of the laser bias level $I_{bias}$ (or optionally both $I_{bias}$ and $I_{mod}$) is ordinarily feedback stabilized against changes in the laser output with aging through a back facet power monitor photodiode (at pins 5 and 6). This circuitry is not illustrated.

Figure 3:
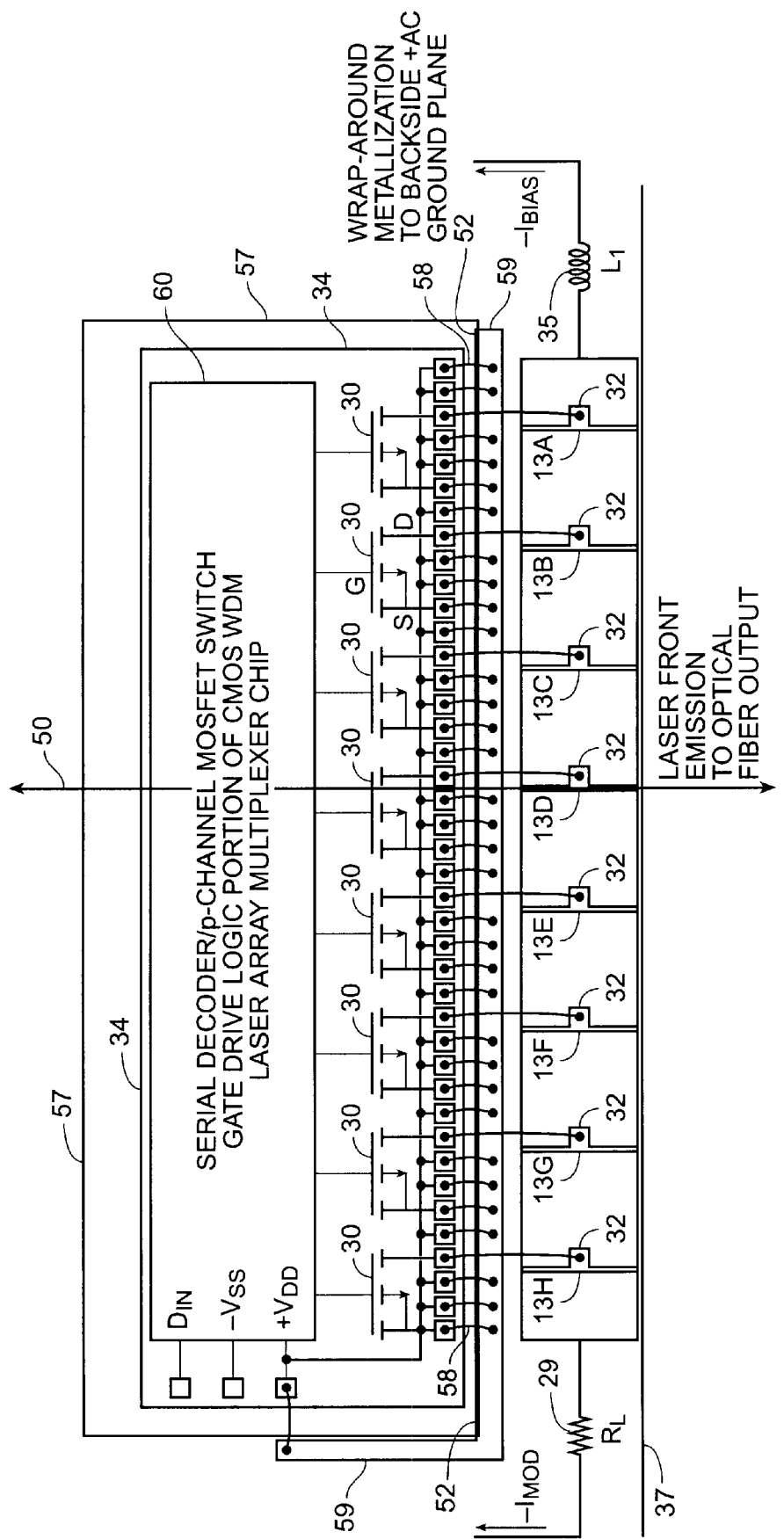
FIG. 3 is a detailed view of a the end of the laser package of FIG. 1 showing the connection of the CMOS switch chip to the laser array bar and package substrate metallization according to the invention.

In the implementation of this invention illustrated in FIGS. 1 and 3, to allow laser selection between different wavelength lasers in a common cathode (n-substrate) WDM laser array, p-channel MOSFETs 30 are used on each of the (p) laser anode leads 32 from the array. To avoid the requirement for high $f_t$, these devices are used only as grounding switches, not as signal transmission devices in which the high-speed data must pass through the gate of the FET. This allows the wideband WDM laser array multiplexer chip 34 ("CMOS controller chip") (FIG. 1) to be fabricated on an inexpensive short-channel CMOS IC process, rather than a very high $f_t$ SiGe or GaAs (or other III–V semiconductor) HBT process (in which, as noted previously, the requisite PNP HBTs or p-channel FETs are not available commercially). In this approach, the dc ($I_{bias}$) and ac ($I_{mod}$) laser currents are applied to the n-substrate 26 (common cathode) connection of the WDM laser array bar 14.

According to the invention, only one of the p-channel MOSFET switches 30 is ordinarily "on" at a time, shorting the anode lead 32 of that particular laser to ground and leaving all of the others "open." The laser current $I_{laser}=I_{bias}+I_{mod}$ is forced to flow through only the selected laser. It is a requirement that the "on" resistance $R_{on}$ of the p-channel MOSFET switching devices 30 be uniformly small in comparison to the transmission line characteristic impedance $Z_o$ and that the drain output capacitance $C_{do}$ be sufficiently small. The "off" MOSFET drain output capacitance is given by $$C_{do} \cong C_{dsub} + C_{dg} + C_{pad} \qquad \text{Eq. 1}$$

where $C_{dg}$ is the drain to gate capacitance and $C_{dsub}$ is the sum of the drain to substrate and drain to source capacitances of the "off" p-channel MOSFET, and $C_{pad}$ is the capacitance of an output wirebond pad to the substrate (normally ac grounded to the $-V_{ss}$ supply).

Typical device sizes for the p-channel MOSFET switches can be derived from these circuit requirements. As a specific example of a commercially available deepsubmicron CMOS IC process, a $2\lambda=0.24$ μm feature size process having drawn $L_g=0.24$ μm MOSFET gates exhibiting an $L_{eff}=0.19$ μm effective gate length is suitable. This process would ordinarily be used with a $V_{dd}-V_{ss}=2.5$V supply voltage, and at $V_{gs}=-2.5$V the p-channel MOSFETs have an "on" resistance x width product of about $R_{on}$ W=1500 Ω-μm. The on resistance $R_{on}$ of the p-channel MOSFET should be far lower than the $Z_o=25$ Ω transmission line impedance; a value of $R_{on}=2.0$ Ω would more than suffice. Substantially larger $R_{on}$ values could be tolerated by simply subtracting the projected $R_{on}$ value from the value of the $R_L=20$ Ω (the termination resistance value calculated assuming an $R_d=5.0$ Ω laser dynamic [ac] resistance); that is, by maintaining the matching condition $$Z_o = R_L + R_d + R_{on} \qquad \text{Eq. 2}$$

Assuming a value of $R_{on}=2.0$ Ω, the required p-channel MOSFET width would be W=1500 Ω-μm/$R_{on}$=750 μm. Since the $I_{dss}$ at $V_{gs}=-2.5$V for the p-channel MOSFET is about 0.3 ma/μm, or 225 ma for W=750 μm, at a typical laser bias current of $I_{laser}=100$ ma, the MOSFET is operating at only 44% if $I_{dss}$, so should be well inside of its linear $I_d$ vs. $V_{ds}$ (resistive) region. For this $R_{on}=2$ Ω case, the value of the termination resistance for a $Z_o=25$ Ω transmission line with $R_d=5$ Ω would be $R_L=25$ Ω–5 Ω–2 Ω=18 Ω. To assure satisfactory dynamic performance of the laser array, the "off" capacitance $C_{do}$ of the MOSFETs connected to the deselected elements in the laser array should be very low. In the deep-submicron bulk CMOS process, the "off" drain capacitance of the p-channel MOSFETs should be in the range of $C_{dsub}+C_{dg}$=0.63 to 0.97 fF/μm, or 0.9 to 1.455 pF for the W=750 μm width. The pad capacitance in this 5 metal layer process is 0.8 aF/μm² plus 24 aF/μm periphery or $C_{pad}$=52.2 fF for a 75 μm×75 μm pad size, giving a total drain output capacitance (Eq. 1) of $C_{do}=C_{dsub}+C_{dg}+C_{pad}$= 1.0 pF to 1.5 pF. A rough measure of the allowable parasitic drain capacitive loading can be obtained by looking at the frequency roll-off that it would cause. If there are N lasers in the WDM laser array (e.g., N=4 or 8 typically), and one is "on" with a dynamic resistance, $R_d$, there will be N−1 of the "off" p-channel MOSFET parasitic drain $C_{do}$ capacitances connected to the array. If the capacitance of an "off" laser is $C_{lo}$, then the total shunt capacitance from the common cathode 26 (n-substrate) of the laser array (aside from whatever capacitive component there may be to the "on" conductance of the operating laser) is given as (N−1) times the series combination of $C_{do}$ and $C_{lo}$, or $$C_{total}=(N-1)/(1/C_{do}+1/C_{lo})\approx(N-1)C_{do} \text{ for } C_{do}<<C_{lo} \quad \text{Eq. 3}$$

The resistive path from this node to ground is the parallel combination of the path through the RL termination resistor plus the line impedance, $Z_o$, and the path through the "on" laser and the "on" p-channel MOSFET, $R_d+R_{on}$, or $$R_{par}=1/[1/(R_d+R_{on})+1/(R_L+Z_o)]\approx R_d+R_{on} \text{ for } (R_d+R_{on})<<Z_o \quad \text{Eq. 4}$$

A measure of the current modulation frequency limitation imposed by the parasitic capacitive current flow through the connections to the N−1 "off" p-channel MOSFET drains is the −3 dB rolloff frequency $f_{-3\,db}$, or the frequency at which the ac current flow through the "on" laser has dropped to 70.71% of its value without the parasitic capacitive current path. The −3 dB rolloff frequency is given by $$f_{-3}\text{ dB}=1/(2\pi R_{par}C_{total})\approx 1/[2(N-1)C_{do}(R_d+R_{on})] \text{ for } C_{do}<<C_{lo} \text{ and } (R_d+R_{on})<<Z_o \quad \text{Eq. 5}$$

Consider the specific example cited of $C_{do}$=1.0 pF to 1.5 pF, $C_{lo}$=3 pF, $R_d$=5 Ω and $R_{on}$=2 Ω for N=4 and 8 laser arrays. This gives $C_{total}$=(N−1)·0.75 pF to (N−1)·1.0 pF and $R_{par}$=7 Ω, which gives $f_{-3\,dB}$=7.58 GHz to 10.1 GHz for N=4 or $f_{-3\,dB}$=3.25 GHz to 4.33 GHz for N=8. In order to minimize degradation of the optical data transmission "eye diagram", operation at signal frequencies approaching $f_{-3\,dB}$ should be avoided. However, even at a 5 GB/s NRZ data rate, the equivalent signal frequency is only 2.5 GHz, so in the N=4 laser case the array is usable at a 5 Gb/s data rate. On the other hand, the N=8 laser array would probably be limited to a data rate of 2.5 Gb/s unless some circuit compensation technique is employed to compensate for the parasitic capacitance. The $C_{do}$=1.0 to 1.5 pF value is based on a 0.24 μm feature size bulk CMOS process. At such time as equivalent feature sizes become commercially available in SOI (silicon on insulator) foundry processes, substantially reduced values of $C_{do}$ will be achievable, particularly if combined with a "low-k" interconnect system (or alternatively, if the wirebond pads on the chip are raised up on a layer of low dielectric constant polymer such as BCB [benzocyclobutene] to reduce pad capacitance). Use of a CMOS/SOI IC process with low-k interconnect dielectrics should, at the same feature size, reduce the $C_{do}$ value about a factor of 2, thus doubling the available half power frequency $f_{-3\,dB}$ and thus doubling the useful data rate (laser dynamics permitting).

It has been determined that the majority of the $C_{lo}$=3 pF "off" laser capacitance is due to the use of a thin (~0.2 μm) $Si_3N_4$ dielectric layer under the anode wirebond pads on the laser array bars. If these "first level" metal pads were made very small, and the full-sized wirebond pads were raised up on top of a reasonably thick (e.g., 5 μm) low-k dielectric such as BCB, the laser $C_{lo}$ value could be greatly reduced, which would also improve the maximum usable data rate.

In order to achieve proper functionality of the CMOS controller chip 34 at high signal frequencies, the CMOS controller chip must be carefully laid out. Specifically, a current path having minimal inductance should be provided from the laser array anode connections through the p-channel MOSFET switches to the +ac ground plane in the package. As shown in FIG. 3, on-chip the parasitic inductance is minimized by placing the p-channel MOSFET switches 30 along the edge of the CMOS die 34 closest to the laser array and by matching each of their positions to that of the laser anodes 32 that each switches. Providing as many current paths in parallel wherever possible is of great value here. This is schematically illustrated in FIG. 1 by the multiplicity of (apparently) redundant connections between the source electrodes of the p-channel MOSFET switches 30 and the package +ac ground plane 39 (and thus the CMOS chip +$V_{dd}$ supply).

FIG. 3 illustrates in more detail a specific approach for minimizing the critical inductance paths in the region between the CMOS chip 34 and WDM laser array bar 14. In FIG. 3 the thinned CMOS die (which is of a thickness about the same as the AlN [aluminum nitride ceramic] package substrate, namely 0.010" or 0.25 mm typical) is mounted in a hole cut through the AlN substrate 37 (sitting on another heat spreader AlN substrate below, which sits on the thermoelectric cooler). One reason for mounting the CMOS die in the cavity in the AlN substrate is to locate it below the plane of the back emission 50 from the lasers, so the back emission laser beams can transit unimpeded to an optical power detector (not shown) used for feedback control of laser output. Another reason is for low inductance. The front edge of the die cavity cutout is covered with "wraparound" metal 52 connecting the +ac ground plane on the bottom surface of the AlN substrate (which is the return path for the ac modulation current $I_{mod}$ flowing in the $Z_o$=25 Ω microstrip transmission line 54 on the top surface) to the topside p-channel MOSFET switch source wirebonding metal stripe area. This forms a low inductance path to ground for the wideband laser modulation currents. Because of the criticality of inductance in this path, many redundant wirebonds 58 are used in parallel for each p-channel MOSFET switch source electrode 56 on the CMOS chip 34. Wraparound metallization 52 provides a low-inductance path along the front of the die cavity cutout through the AlN substrate connecting the topside MOSFET source bonding pad stripe 59 to the backside +ac ground plane. Since all of the p-channel MOSFET source leads are connected in parallel on the CMOS chip (as well as being connected to the CMOS logic +$V_{dd}$ supply), the inductance from these sources to +ac ground is minimal.

The wirebond inductance should be minimized between the drain pads on the CMOS chip and the laser anode bonding pads on the laser array bar. As in FIG. 3, this can be accomplished by placing the p-channel MOSFETs and their drain bonding pads on precisely the same lateral pitch as the laser anode bonding pads and minimizing the separation between the edge of the CMOS die and the back edge of the WDM laser array bar to so the wirebonds 58 are minimal length. If the laser anode wirebond pads are raised up onto a relatively thick (e.g., 5 μm) low-k dielectric layer (e.g., BCB), then two wirebond pads per laser anode (located about 20% to 25% of the way from the front and back faces of the laser stripes) could be utilized, which would substantially reduce both the wirebond inductance (because the parallel wires tend to behave like a wide metal ribbon having low self-inductance) and the dynamic resistance, $R_d$, of the lasers. The reduced inductance L improves the L/R time constant (where the R is associated principally with $Z_o$), increasing the speed, and the reduction in $R_d$ also improves the frequency response, as in Equation 5, for example.

The size requirements of the CMOS die are dictated principally by the need that the die be about as long as the WDM laser array bar (e.g., 4 mm for an N=8 array, or 2 mm for an N=4 array), and there is a practical limitation (typically 4:1 or less) to the die aspect ratio (length to width ratio). The die area required for each of the p-channel MOSFET switches on the CMOS die is only about 550 $\mu m^2$ (for W=1500 $\mu$m, $R_{on}$=2 $\Omega$), which is about 10% of the area of a 75 $\mu$m×75 $\mu$m drain wirebond pad. Since a typical laser anode current does not typically exceed $I_{laser}$=100 ma, the power dissipation $P_D=I_{laser}^2 R_{on}$ in the selected p-channel MOSFET devices is only $P_D$=20 mW, a relatively low power density which should not represent any thermal challenges on the CMOS chip.

The remainder of the area of the CMOS chip is used for the serial decoder/p-channel MOSFET switch gate drive logic 60 (FIGS. 1 and 3). In typical operation, a serial data stream is applied, either continuously or intermittently, through one of the previously NC (no-connect) package pins (pins 10 and 14 in FIG. 1), and the gate voltage on the selected p-channel switch MOSFET is changed from its normal "off" level of $+V_{dd}$ (which is at the +ac ground potential here) to its selected "on" level of $V_{ss}$ (which will be at a dc potential 2.5 volts more negative than $V_{dd}$ or +ac ground for the 0.24 $\mu$m bulk CMOS process technology). All of the unselected p-channel MOSFET switch gates remain at their "off" level of $V_{dd}$. (An exception is during the initial laser burn-in operation when a control voltage is applied to the burn-in override pad 18.) Because of the simplicity of this serial decoder/p-channel MOSFET switch gate drive logic functionality, the chip area requirements for implementing it are minimal.

The invention has been explained with reference to specific embodiments. Other embodiments will be evident to those of ordinary skill in the art. It is therefore intended that the invention not be limited, except as indicated by the appended claims.

What is claimed is:

1. An IC laser array package comprising:
   a solid state semiconductor laser array having a common contact to cathode electrodes of the lasers on a semiconductor substrate of the laser array and independent contacts to anode electrodes of each of the lasers in the array; and
   a laser array controller as an integrated circuit, said array controller having a corresponding array of independently controllable switches, wherein one independently controllable switch is provided for each one of said laser anode contacts, wherein each said independently controllable switch is operative to select by shorting one of said laser anode contacts to a supply voltage (ac ground) with low impedance while maintaining a high impedance to current flow from deselected laser anode contacts.

2. The laser array package according to claim 1 wherein said laser array controller is fabricated using one of the following commercial bulk semiconductor technologies:
   a standard CMOS process,
   a standard CMOS on insulator process.

3. The laser array package of claim 2 wherein said independently controllable switchers are p-channel MOSFET elements.

4. The laser array package of claim 1 wherein said independently controllable switches are constrained to engage one at a time during normal operation.

5. The laser array package of claim 1 wherein said independently controllable switches are electrically coupled to a common power supply (ac ground) voltage.

6. The laser array package of claim 5 wherein said common power supply or ac ground voltage is supplied principally through an ac ground plane on the bottom side of the package substrate, said ac ground plane forming a primary return path for ac modulation current applied to the selected laser in the array.

7. The laser array package according to claim 3, wherein said power source (ac ground) is coupled to a source terminal of each said MOSFET element through a plurality of low inductance conductors.

8. The laser array package of claim 1 wherein each said independently controllable switch is a p-channel MOSFET switch, wherein the anode of each laser of the array is connected to the drain of a corresponding one of said p-channel MOSFET switches.

9. The laser array package of claim 3 wherein a modulating signal from a driver input is coupled to be applied to said substrate of common cathodes, together with a negative do bias current provided through an inductor.

10. The laser array package according to claim 3 wherein each said p-channel MOSFET switch is disposed along an edge of a die of said laser array controller for mounting adjacent corresponding terminals to said laser array.

11. The laser array package according to claim 3 wherein said CMOS die is mounted to be sufficiently offset from said laser array to avoid blocking backside illumination.

12. The laser array package according to claim 11, wherein at least one sidewall of the cavity cutout in the package substrate is metallized to provide a very low inductance and resistance path to the ac ground plane on the bottom of the substrate for carrying laser currents.

13. The laser array package according to claim 3, wherein said CMOS die is mounted in a cavity cutout of a package substrate of sufficient depth relative to said laser array to avoid blocking backside illumination.

14. A method for fabricating a wave division multiplexed laser array in a standard low pin count laser package comprising:
   providing an array of solid state semiconductor lasers having a common contact to cathode electrode of the lasers in a substrate and independent contacts to anode electrodes of each of the lasers in the array; and
   providing, adjacently mounted to said array, a laser array controller fabricated using standard semiconductor integrated circuit (IC) processes, said laser array controller comprising an array of independently controllable switches, wherein one independently controllable switch is provided for each one of said laser anode contacts, wherein each said independently controllable switch is operative to select by shorting one of said laser anode contacts to a supply voltage (ac ground) with low impedance while maintaining a high impedance to current flow from deselected laser anode contacts.

15. The method of claim 14 wherein said independently controllable switches are p-channel MOSFET devices formed with one switch for each one of said switch-coupled anodes, each said switch being operative to short each corresponding anode of a corresponding laser in an adjacently mounted laser array to a common ground in an OFF mode and to a power source in an ON mode, only one of said switches being switched on at a time.

16. The method of claim 1 wherein said laser array controller is fabricated using one of the following commercial bulk semiconductor technologies:

a standard CMOS process, a standard CMOS on insulator process.

17. The method according to claim 16 wherein said array controller is formed on a CMOS die and said CMOS die is mounted in a cavity cutout to be sufficiently offset from said laser array to avoid blocking backside illumination.

18. The method according to claim 17 wherein said package substrate cavity cutout has sidewall metallization on at least the side between the laser array and the CMOS die array controller in order to provide a very low impedance current path to an ac ground plane on the bottom of the package substrate for the laser anode currents flowing through the MOSFET switches and through a plurality of conductors between the CMOS die and package substrate.

19. An IC laser array package comprising:

a solid state semiconductor laser array on a semiconductor substrate having a single common co tact to one of either a cathode or an anode of individual lasers on the semiconductor substrate of the laser array and having independent contacts to the other one of either the cathode or anode of each of the lasers in the array; and a laser array controller as an integrated circuit, said array controller having a corresponding array of independently controllable switches, wherein one independently controllable switch is provided for each one of said independent contacts, each said independently controllable witch being operative to being selected by shorting one of said laser contacts to ac ground as its supply voltage with low impedance while maintaining a high impedance to current flow from deselected laser independent contacts.

* * * * *